(12) United States Patent
Campion

(10) Patent No.: US 8,483,409 B2
(45) Date of Patent: Jul. 9, 2013

(54) VOLUME ADJUSTMENT FOR MULTIPLE VOICE OVER INTERNET PROTOCAL STREAMS

(75) Inventor: Nicholas F. Campion, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1167 days.

(21) Appl. No.: 12/143,989

(22) Filed: Jun. 23, 2008

(65) Prior Publication Data
US 2009/0316932 A1 Dec. 24, 2009

(51) Int. Cl.
*H04R 25/00* (2006.01)

(52) U.S. Cl.
USPC ........... 381/107; 381/104; 381/105; 381/108; 381/109; 370/395.52; 370/395.53; 370/395.5; 379/388.02; 379/388.03; 379/388.04; 379/388.05; 379/388.06; 379/390.01; 379/395

(58) Field of Classification Search
USPC .......... 381/104, 105, 107, 108, 109; 379/388, 379/388.02, 388.03, 388.04, 388.05, 388.06, 390.01, 395; 370/395.5, 395.52, 395.53
See application file for complete search history.

(56) References Cited

U.S. PATENT DOCUMENTS

| | | | | |
|---|---|---|---|---|
| 2009/0073961 A1* | 3/2009 | Jayapalan et al. | ............ | 370/352 |
| 2009/0262668 A1* | 10/2009 | Hemar et al. | ................. | 370/260 |

\* cited by examiner

*Primary Examiner* — Kimberly Rizkallah
*Assistant Examiner* — Timor Karimy
(74) *Attorney, Agent, or Firm* — Cantor Colburn LLP

(57) ABSTRACT

Systems and methods for managing the volume of multiple VoIP streams are disclosed. The system includes a VoIP server configured to receive an input audio stream from a first VoIP handset, create separate output audio streams from the input audio stream for transmission to second and third VoIP handsets, and to connect to a communications network. The system also includes a volume control table coupled to the VoIP server, the volume control table including records of volume adjustments made during prior conversations between the two or more VoIP handsets. The VoIP server is further configured create the separate output audio streams such that one or more of the output streams has a volume that is different than input audio stream based on the records.

15 Claims, 4 Drawing Sheets

VOLUME ADJUSTMENT FOR MULTIPLE VOICE OVER INTERNET PROTOCAL STREAMS

BACKGROUND

The present invention relates generally to Voice over Internet Protocol (VoIP) and, more particularly, to adjusting the volume for multiple VoIP streams.

In VoIP telephony a speaker speaks into a handset (or other receiving device) and a stream of digital information is created there from. This digital stream is transmitted through a VoIP server to a receiver or a call (typically another person to whom the call has been placed). The receiver's handset (or other reception device connected thereto) decodes the digital stream and produces an analog output that ultimately drives a speaker audible to the receiver. Of course, the VoIP server may perform more than just "pass-through" routing. For instance, the server may convert the digital stream from one format to another if the speaker and the receiver are utilizing different types of handsets or handsets that support different protocols.

When connected to a VoIP (or traditional) conference call where multiple speakers are speaking, different voice types and connection types can cause different speakers to have dramatically different volumes. This may lead to difficulties in hearing some speakers relative to other speakers. For instance, one speaker may speak quieter than another speaker and it may be difficult to hear that speaker speak.

In the VoIP environment, one solution is to raise or lower the reception volume of all incoming audio streams at the receiver. That is, each stream is amplified or reduced by the VoIP handset by the same amount. One problem with this solution is that because the volume of all speakers are adjusted by the same amount, a quiet speaker may still sound quite when compared to a loud speaker.

Another solution includes having participants amplify or reduce the transmit volume of their handsets so that all persons are similarly loud. This produces good results on the receiver side when adequately adjusted, but the configuration amongst many participants can be tedious.

SUMMARY

One embodiment of the present invention is directed to a system for managing the volume of multiple VoIP streams. The system of this embodiment includes a VoIP server configured to receive an input audio stream from a first VoIP handset, create separate output audio streams from the input audio stream for transmission to second and third VoIP handsets, and to connect to a communications network. The system of this embodiment also includes a volume control table coupled to the VoIP server, the volume control table including records of volume adjustments made during prior conversations between the two or more VoIP handsets. The VoIP server of this embodiment is further configured to create the separate output audio streams such that one or more of the output streams has a volume that is different than input audio stream based on the records.

Another embodiment of the present invention is directed to a method of adjusting volume for multiple VoIP steams. The method of this embodiment includes receiving an input audio stream from a first user; creating a first output stream for delivery to a second user, the first output stream having a first volume; creating a second output stream for delivery to a third user, the second output stream having a second volume, wherein the second volume is different than the first volume.

BRIEF DESCRIPTION OF THE DRAWINGS

Referring to the exemplary drawings wherein like elements are numbered alike in the several Figures.

DETAILED DESCRIPTION

Embodiments of the present invention are directed to methods for automatically adjusting the volume of a conversation between users based on the location an audio stream is initiated from and information gathered from prior conversations between the two locations. In short, the volume of a VoIP conversation is adjusted on a per-user basis.

For example, if user A calls user B and user B adjusts the volume at which user A's voice is reproduced, the VoIP server according to the present invention creates a record of this adjustment in a volume control table the adjustment. The volume control table may be arranged so that it has speaker and receiver indices. From that point forward, the VoIP server applies a volume adjustment to calls between A and B based on the information stored in the volume control table.

In the context of a VoIP conference call involving multiple users, for example, users A, B, and C, because the audio record from user A and user B's earlier conversation is already in existence, the VoIP server can apply that to the audio from A to B without affecting the audio from user C. This is one difference between this capability using VoIP and traditional phones. Further, volume adjustments may be performed on a user-by-user basis. This means that user A has a profile for every other user that user A talks to. That profile is referenced every time audio is to be sent to him to determine if any of the streams (a stream is an individual speaker's audio) need to be adjusted based on the receiver's preference. In some embodiments, each profile is contained in a table. In a conference call situation, if user A is on a conference call with users B and C and hits the increase volume button, a volume adjustment is made to the audio stream being delivered to user A for the person who had spoken an predetermined previous time period. That is, for example, the stream of the person who spoke in the last half second (or other time period) is adjusted. If multiple users had spoken, all users are given the adjustment. These adjustments are stored again for future use. Operating in this manner retains the granular nature of the per user volume adjustments without making management overwhelming.

Figure 1:
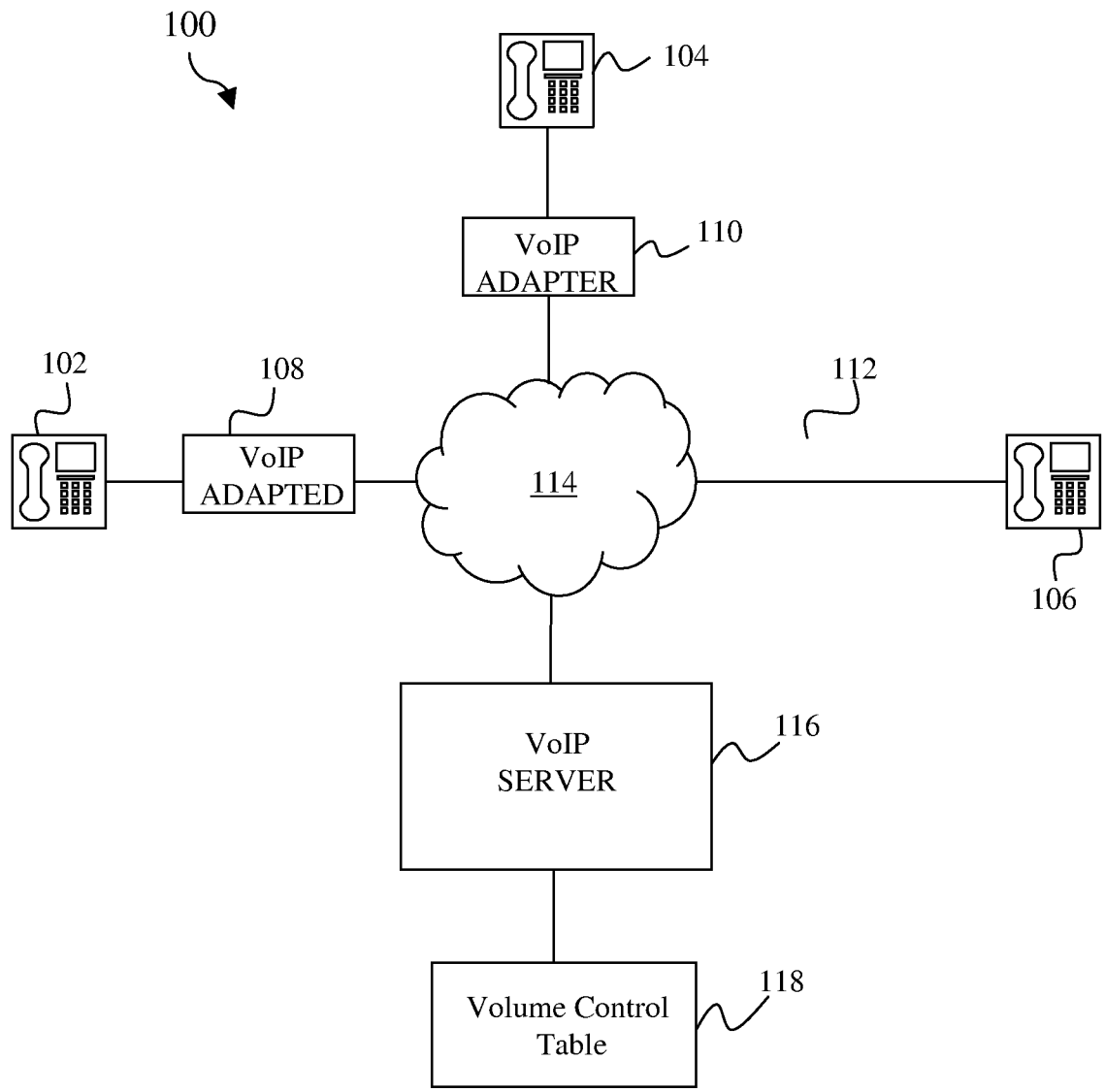
FIG. 1 shows a system according to one embodiment of the present invention.

FIG. 1 shows an example of a system 100 according to an embodiment of the present invention. The system 100 includes multiple user handsets. In one embodiment, the system 100 may include a first VoIP handset 102, a second VoIP handset 104 and a third handset 106. Of course, the number of user handsets is not limited to three and any number of user handsets may be part of the system 100. In one embodiment, the VoIP handsets may be traditional telephone handsets. The term "handset" as used herein is not limited to a handheld device and may be any device capable of receiving an input sound (typically voice) signal and converting it to an analog signal. Examples include, but are not limited to, traditional telephone handsets, wireless devices, headset and computers working as a so-called "soft phone."

Each VoIP handset is connected to a VoIP adapter. As shown, the first VoIP handset 102 is coupled to the first VoIP adapter 108 and the second VoIP handset 104 is coupled to the second VoIP adapater 110. Of course, the VoIP adapters may be part of the VoIP handset itself and not implemented as a separate device. The VoIP adapters serve to convert the traditional analog phone signal to a digital stream that may be transmitted over a communications network, for example, the Internet.

When using a hardware based VoIP phone-device/phone-adapter it is possible to connect traditional analog phones directly to a VoIP phone-adapter without the need to operate a computer. The converted analog phone signal can then be connected to multiple house phones or extensions, just as any traditional phone company signal can be connected. A second VoIP hardware configuration option involves the use of a specially designed VoIP telephone which incorporates a VoIP phone adapter directly into the phone itself, and which also does not require the use of a computer.

Regardless of the configuration, telephone calls may be placed between the handsets over a communications network 114. The communications network may also couple the VoIP handsets to a VoIP server 116.

The communications network 114 may be any type of known network including, but not limited to, a wide area network (WAN), a public switched telephone network (PSTN) a local area network (LAN), a global network (e.g. Internet), a virtual private network (VPN), and an intranet. The communications network 114 may be implemented using a wireless network or any kind of physical network implementation known in the art. The VoIP handsets (e.g., VoIP handsets 102, 104) may be coupled to the VoIP server 116 through multiple networks (e.g., intranet and Internet) so that not all handsets are coupled through the same network. Furthermore, the handset 106 may be connected to the VoIP server by a combination of a PSTN and the Internet, for example. One or more handsets and the VoIP server 116 may be connected to the communications network 114 in a wireless fashion.

The VoIP server 116 depicted in FIG. 1 may be implemented using one or more servers operating in response to a computer program stored in a storage medium accessible by the server VoIP 116. The VoIP server 116 may operate as a network server (e.g., a web server) to communicate with the handsets 102, 104 and 106. The VoIP server 116 handles sending and receiving information to and from the handsets and can perform associated tasks. The VoIP server 116 may also include firewalls to prevent unauthorized access and enforce any limitations on authorized access. For instance, an administrator may have access to the entire system and have authority to modify portions of the system. A firewall may be implemented using conventional hardware and/or software as is known in the art.

The system 100 may also include a volume control table 118. As depicted, the volume control table 118 is directly coupled to the VoIP server 116. Of course, the volume control server 118 could be part of the VoIP server 116 or could be coupled thereto in other manners.

In operation, the system 100 may operate as follows. A call is placed at the first VoIP handset 102 to the second VoIP handset 104. A user speaks into the first VoIP handset 102 and the first VoIP adapter 108 converts the analog signal into a digital signal. The digital signal is transferred over the communications network 114 to the VoIP server 116. The VoIP server 116 receives the digital signal (referred to herein from time to time as an input audio stream) and forwards it to the receiver located at the second VoIP handset 104. Of course, the digital signal is converted to analog by the second VoIP adapter 110.

In one embodiment, before the input audio stream is forwarded to the receiver, the VoIP server 116 may consult the volume control table 118 to determine if the volume of the audio stream should be adjusted before it is forwarded to the receiver. As discussed above, the volume control table 118 may include entries that correlate between users and keeps track of volume adjustments made during telephone conversations between the users. In one embodiment, during a conversation between, for example, a user of the first VoIP handset 102 and a user of second VoIP handset 104, if the user of the second VoIP handset 104 adjusts the volume of the call while the user of the first VoIP handset 102 is speaking, the volume adjustment is stored in the volume control table 118. Each time a signal is received from the first VoIP handset 104 that has a destination that includes the second VoIP handset 106, the volume of the signal is adjusted by the VoIP server 116 based on information stored in the volume control table 118. For example, if, on a first call between the first VoIP handset 102 and the second VoIP handset 104, the user of the second VoIP handset 104 adjusts the volume upwardly, during that same call and on all calls going forward, any communication from the first VoIP handset 102 to the second VoIP handset 104 will have the volume increased.

In the context of a conference call, the system will operate in the same manner. For instance, if the user of the first VoIP handset 102 is speaking to users located at the second VoIP handset 104 and the third handset 106, the volume of the communication delivered to each user will be amplified in the VoIP server 116 based on information stored in the volume control table. Of course, the third handset, which may be a conventional phone, may be coupled to the conference call by know techniques.

Figure 2:
FIG. 2 shows an example of a volume control table according to one embodiment of the present invention.

FIG. 2 depicts a graphical representation in a grid format of a volume control table 118 according to one embodiment of the present invention. The vertical axis represents an ID assigned to possible recipients of VoIP communication and the horizontal axis represents an ID assigned to possible speakers. Of course, the format of the volume control table is not limited to that shown in FIG. 2.

As discussed above, during a call, including a conference call, an input audio stream is received from a handset by the VoIP server 116 (FIG. 1) and routed to the recipient(s). Included in the process of routing, the volume level of the stream may also be adjusted. As shown in FIG. 2, there may be n handsets that may communicate with each other. This example assumes that all handsets coupled to the system are known. Of course, provisions could be made to add new handsets as they appear. For instance, each time a call is placed between an existing handset and a new handset, the new handset could be added to the volume control table 118.

The table 118 may be utilized as follows in the context of a conference call. An audio stream may be created (i.e., spoken) by a user of a phone having phone ID 1. The audio stream is to be directed to phone ID's 2 and 3. To route and adjust the stream delivered to phone ID 2, the table is consulted at the horizontal location for phone ID 2 and, for an audio stream received from phone ID 1, the volume of the stream delivered to phone ID 2 is increased by a value of +4. For the same audio stream delivered to phone ID 3, the volume is decreased by a value of −2. The values in FIG. 2 are merely for illustration. Any type of value may be used. For example, a decibel multiplier could be employed.

Figure 3:
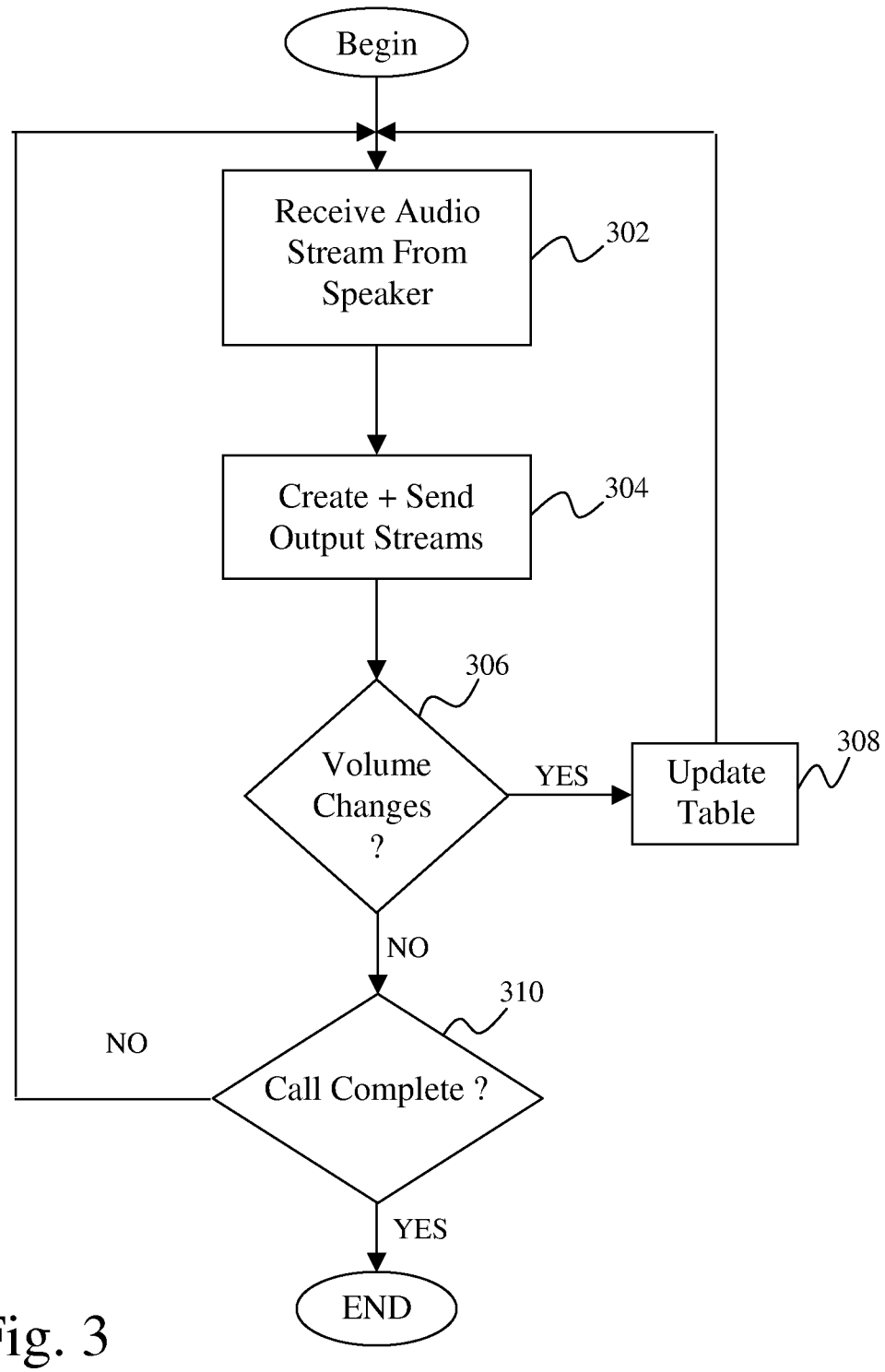
FIG. 3 shows a flow diagram of a method according to one embodiment of the present invention.

FIG. 3 shows a high-level block diagram of a method of adjusting the volume of multiple voice streams. The method of FIG. 3 may be implemented in the context of a conference call having, for example, participants A, B, and C and on a system such as shown in FIG. 1.

At a block 302 an input audio stream is received at the VoIP server from a speaker, for example, from participant A. As discussed above, the input audio stream may be a digital representation of an audio signal (i.e., speech) created by participant A. As a conference call is in progress, the audio stream may include two or more destinations. In this example, the destinations are participants B and C. The input audio stream may include a base volume level encoded therein.

At a block 304 output audio streams are created and sent to the destinations by the VoIP server. In one embodiment, a separate audio stream may be created for each destination. For example, an input audio stream may be received from participant A and a separate audio output audio stream may be created for participants B and C. In one embodiment, the stream for participant B may have a different volume than the stream for participant C and the volume of each stream is determined by accessing the volume control table. Of course, if after consulting the volume control table it is determined that the volume for participants B and C should be the same, a separate stream need not be created for each of them.

At a block 306 it is determined if any volume changes have recently occurred. If so, the volume control table is updated at a block 308. The update may be performed in many different manners so long as the each time the participant receives an audio stream from the speaker for which they adjusted the volume, the audio stream is adjusted to the level of the manual adjustment made by the participant. In some embodiments, a determination of the speaker who was adjusted is determined by selecting the speaker who spoke during an immediately preceding time period. In some embodiments, the time period may be, for example, one half second. In the case where multiple speakers were speaking when the volume is adjusted, all of them may be adjusted accordingly.

At a block 310 it is determined if the call is complete. If so, the process ends. Otherwise, the process returns to block 302.

Figure 4:
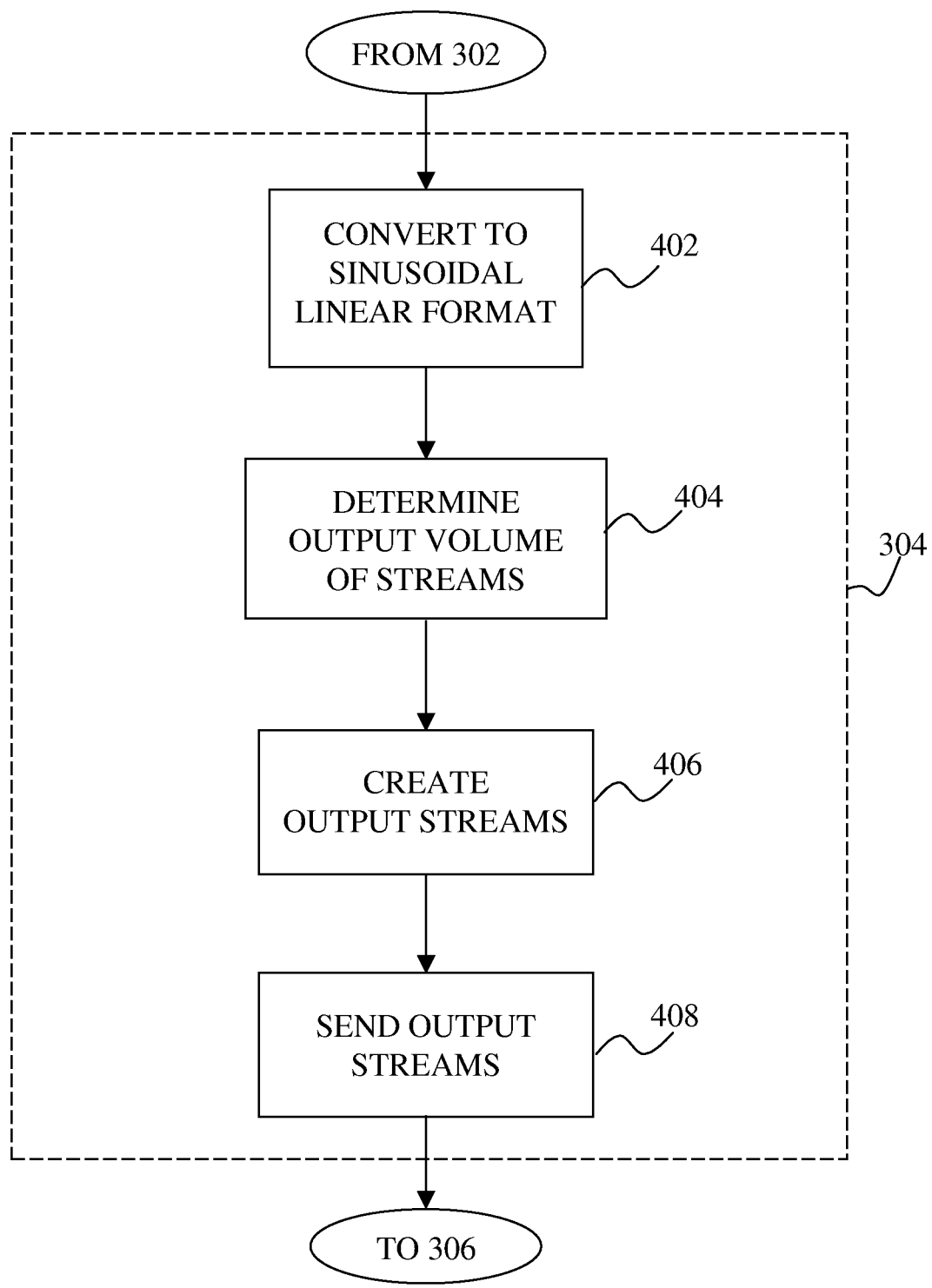
FIG. 4 shows a more detailed flow diagram of one portion of the method shown in FIG. 3.

FIG. 4 shows a more detailed depiction of the process performed in block 304 of FIG. 3. At a block 402, the input audio stream is converted to a sinusoidal linear format. Such a conversion is well known in the art. At a block 404 volume adjustments for each recipient are determined by consulting the volume control table. Adjusting the volume, as one of skill in the art will readily realize, may be accomplished by known techniques. Based on the volume adjustments, an output stream for each recipient may be created at a block 406. Of course, in some embodiments, if two or more recipients have the same volume, only one stream for these recipients may be created. At a block 408, the output streams are sent to the recipients.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A system for managing the volume of multiple VoIP streams, the system comprising:
   a VoIP server configured to receive an input audio stream from a first VoIP handset, create separate output audio streams from the input audio stream for transmission to a second VoIP handset and a handset, and to connect to a communications network; and
   a volume control table coupled to the VoIP server, the volume control table including records of volume adjustments made by a user on the user's handset during prior conversations between the two or more VoIP handsets;
   wherein the VoIP server is further configured to create the separate output audio streams such that one or more of the output streams has a volume that is different than input audio stream based on the records.

2. The system of claim 1, wherein the first VoIP handset is coupled to a VoIP adapter.

3. The system of claim 1, further including the communications network.

4. The system of claim 3, wherein the communications network is the Internet.

5. The system of claim 1, wherein the volume control table includes per user volume control records.

6. The system of claim 1, wherein the VoIP server is configured to convert the input audio stream into a sinusoidal linear format stream.

7. The system of claim 6, wherein the VoIP server is configured to create the separate output audio streams from the sinusoidal linear format stream.

8. The system of claim 7, wherein VoIP server is configured to not create a separate output stream for a third VoIP handset that has a same volume adjustment record as the second VoIP phone.

9. The system of claim 1, wherein the handset is a VoIP handset.

10. A method of adjusting volume for multiple VoIP steams, the method comprising:
   receiving an input audio stream from a first user;
   creating a first output stream for delivery to a second user, the first output stream having a first volume; and creating a second output stream for delivery to a third user, the second output stream having a second volume, wherein the second volume is different than the first volume;

wherein creating the first and second output streams includes accessing a volume control table to determine the first volume and the second volume and wherein the volume control table includes a record of prior volume adjustments made by the second user on the second user's handset to a prior input audio stream received from the first user.

11. The method of claim 10, wherein creating the first output stream includes converting the input audio stream to a sinusoidal linear format.

12. The method of claim 11, wherein creating the second output stream includes converting the input audio stream to a sinusoidal linear format.

13. The method of claim 12, further comprising:
transmitting the first output steam to the second user; and
transmitting the second output stream to the third user.

14. The method of claim 13, further comprising:
receiving an indication that the second user adjusted the volume of the first output stream.

15. The method of claim 14, further comprising:
updating the volume control table based on the indication.

* * * * *